US012602525B2

(12) United States Patent
Sayed et al.

(10) Patent No.: US 12,602,525 B2
(45) Date of Patent: Apr. 14, 2026

(54) ENHANCED TECHNIQUES FOR ANALYZING INDUCTION MOTORS

(71) Applicant: Tesla, Inc., Austin, TX (US)

(72) Inventors: Ayesha Sayed, West Lafayette, IN (US); Hao Ge, Palo Alto, CA (US); Konstantinos Laskaris, Burlingame, CA (US); Dionysios Aliprantis, West Lafayette, IN (US)

(73) Assignee: Tesla, Inc., Austin, TX (US)

( * ) Notice: Subject to any disclaimer, the term of this patent is extended or adjusted under 35 U.S.C. 154(b) by 934 days.

(21) Appl. No.: 17/772,289

(22) PCT Filed: Nov. 10, 2020

(86) PCT No.: PCT/US2020/059877
§ 371 (c)(1),
(2) Date: Apr. 27, 2022

(87) PCT Pub. No.: WO2021/096880
PCT Pub. Date: May 20, 2021

(65) Prior Publication Data
US 2022/0405443 A1 Dec. 22, 2022

Related U.S. Application Data

(60) Provisional application No. 62/933,892, filed on Nov. 11, 2019.

(51) Int. Cl.
*G06F 30/23* (2020.01)
(52) U.S. Cl.
CPC ..................................... *G06F 30/23* (2020.01)
(58) Field of Classification Search
CPC ................................ G06F 30/23; H02K 17/16
See application file for complete search history.

(56) References Cited

U.S. PATENT DOCUMENTS

2003/0163296 A1* 8/2003 Richards ................. H02P 21/16
703/14
2005/0278160 A1 12/2005 Donnelly et al.
2009/0284204 A1 11/2009 Colby et al.

FOREIGN PATENT DOCUMENTS

JP          2001-318132          11/2001
JP          2010-026595          2/2010
WO          WO 17/126093          7/2017

OTHER PUBLICATIONS

Yilmaz, Murat, and Philip T. Krein. "Capabilities of finite element analysis and magnetic equivalent circuits for electrical machine analysis and design." 2008 IEEE power electronics specialists conference. IEEE, 2008 (Year: 2008).*
(Continued)

*Primary Examiner* — Saif A Alhija
(74) *Attorney, Agent, or Firm* — Knobbe, Martens, Olson & Bear, LLP

(57) ABSTRACT

Systems and methods for enhanced techniques for analyzing induction motors. An example method includes accessing circuit model information associated with an induction motor (IM), the circuit model information representing rotor bars of the IM as each including respective rotor segments. Rotor segment nominal currents associated with the rotor segments are determined, with the determination being based on performing finite element analysis (FEA) over a grid and use of a linearized circuit model. Rotor segment ripple currents associated with the rotor segments are determined, with the determination being based on performance of FEA to extract flux ripple samples over the grid, with the flux ripple samples being transformed into a time-varying rotor flux ripple signal, and with the rotor segment ripple currents being determined based on the time-varying rotor flux ripple signal. Losses associated with the IM are determined.

13 Claims, 6 Drawing Sheets

(56)             References Cited

OTHER PUBLICATIONS

Kang, Seog-Joo, and Seung-Ki Sul. "Efficiency optimized vector control of synchronous reluctance motor." IAS'96. Conference Record of the 1996 IEEE Industry Applications Conference Thirty-First IAS Annual Meeting. vol. 1. IEEE, 1996 (Year: 1996).*

Akpinar et al., Dec. 1993, Modeling and analysis of closed-loop slip energy recovery induction motor drive using a linearization technique, IEE Transactions on Energy Conversion, 8(4):688-697.

Alberti et al., Mar./Apr. 2011, Variable-speed induction machine performance computed using finite-element, IEEE Transactions on Industry Applications, 47(2):789-797.

Hinkkanen et al., May/Jun. 2010, Small-signal modeling of mutual saturation in induction machines, IEEE Transactions on Industry Applications, 46(3):965-973.

Sprangers et al., Sep. 2, 2014, Calculation of induced rotor current in induction motors using a slotted semi-analytical harmonic model, Proceedings of the IEEE 2014 International Conference on Electrical Machines, pp. 2709-2714.

International Search Report and Written Opinion dated Feb. 25, 2021 in application No. PCT/US2020/059877.

Written Opinion dated Oct. 21, 2021 in application No. PCT/US2020/059877.

International Preliminary Report on Patentability dated Feb. 18, 2022 in application No. PCT/US2020/059877.

Sykes, Jan. 1977, Calculation of incremental inductances for digital simulation of transformers using matrix transformations, Proceedings of the IEEE, 65(8):1227-1228.

* cited by examiner

200

202
Access circuit model information associated with induction motor (IM)

204
Determine rotor bar segment nominal currents via FEA and linearized circuit model 206
Determine rotor bar segment ripple currents via FEA and linearized circuit model 208
Determine loss associated with IM (c) Time variation of λ

ENHANCED TECHNIQUES FOR ANALYZING INDUCTION MOTORS

BACKGROUND

Field

The present disclosure relates to induction motors, and more particularly to enhanced modeling techniques for induction motors.

Description of the Related Art

The design of an induction motor (IM), such as a squirrel-cage IM, generally involves complex modeling prior to fabrication of the IM. For example, modeling may be performed to generate an IM efficiency map over an entire steady-state operation domain. The IM efficiency map may allow for an understanding of loss during use of the IM.

At present, techniques to perform such modeling requires a large amount of computing resources, such as processing components, memory, processing time, to viably analyze large numbers of IM variations. Current techniques to analyze physical characteristics of an IM design (e.g., loss characteristics) may leverage time-stepping finite element analysis (FEA). Due to the great computational complexity required by computing resources configured to implement such FEA techniques, resulting analyses may take days or weeks of processing time. Due to this substantial processing time, an entity may have limited ability to optimize an IM through modeling substantial variations while adhering to a product release schedule. In this way, the entity may be hindered through present inefficient modeling techniques.

Other techniques to perform modeling fail to provide accuracy required for production-level IMs. For example, other techniques may model an IM without the use of FEA. Such techniques may reduce a processing time but may be infeasible for use in designing optimized IMs due to their limited accuracy.

SUMMARY

Some non-limiting embodiments include a method implemented by a system of one or more processors. The method includes accessing circuit model information associated with an induction motor (IM), the circuit model information reflecting a plurality of rotor bars of the IM as being segmented into a respective plurality of rotor segments; determining rotor segment nominal currents associated with the rotor segments, wherein the determination is based on performing finite element analysis (FEA) over a grid and use of a linearized circuit model; determining rotor segment ripple currents associated with the rotor segments, wherein the determination is based on performance of FEA to extract flux ripple samples over the grid, wherein the flux ripple samples are transformed into a time-varying rotor flux ripple signal, and wherein the rotor segment ripple currents are determined based on the time-varying rotor flux ripple signal; and determining one or more losses associated with the IM, wherein the losses are configured for presentation.

Some other non-limiting embodiments include a system comprising one or more processors and non-transitory computer storage media storing instructions that when executed by the one or more processors, cause the processors to perform operations. The operations comprise determining rotor segment nominal currents associated with an induction motor (IM), the IM being reflected in circuit model information representing a plurality of rotor bars each comprising a respective plurality of rotor segments, wherein the rotor segment nominal currents are associated with the rotor segments, and wherein the determination is based on performing finite element analysis (FEA) over a grid; determining rotor segment ripple currents associated with the rotor segments, wherein the determination is based on performance of FEA to extract flux ripple samples over the grid, wherein the flux ripple samples are transformed into a time-varying rotor flux ripple signal, and wherein the rotor segment ripple currents are determined based on the time-varying rotor flux ripple signal; and determining one or more losses associated with the IM.

Some other non-limiting embodiments include non-transitory computer storage media storing instructions that when executed by a system of one or more processors, cause the one or more processors to perform operations. The operations comprise determining rotor segment nominal currents associated with an induction motor (IM), the IM being reflected in circuit model information representing a plurality of rotor bars each comprising a respective plurality of rotor segments, wherein the rotor segment nominal currents are associated with the rotor segments, and wherein the determination is based on performing finite element analysis (FEA) over a grid; determining rotor segment ripple currents associated with the rotor segments, wherein the determination is based on performance of FEA to extract flux ripple samples over the grid, wherein the flux ripple samples are transformed into a time-varying rotor flux ripple signal, and wherein the rotor segment ripple currents are determined based on the time-varying rotor flux ripple signal; and determining one or more losses associated with the IM.

In the above embodiments, determining rotor bar segment nominal currents includes extracting time-averaged inductance matrices via performance of FE and determining the rotor segment nominal currents using the time-averaged inductance matrices as an input to the linearized circuit model. Each rotor bar may be segmented using uniform segmentation. Each rotor bar may be segmented using a geometric series, and wherein the rotor segments narrow along a radial direction of the rotor bar. The linearized circuit model represents a circuit model of the IM transformed into a synchronously rotating frame. The grid is periodic with respect to a first electrical angle associated with synchronous speed and a second electrical angle associated with slip frequency, and wherein performance of FEA is limited to positions within respective periods of the first electrical angle and second electrical angle, such that performance of FEA is constrained. Transforming the flux ripple samples comprises performing a two-dimensional transform of the flux ripple samples, wherein transform coefficients are obtained; performing an inverse two-dimensional transform based on the transform coefficients; and obtaining, based on the inverse two-dimensional transform, the time-varying rotor flux ripple signal. The inverse two-dimensional transform is performed using an interpolation function which comprises the transform coefficients. The losses comprise one or more of cage loss or core loss. Cage loss is determined based on a first loss associated with the rotor segment nominal currents and a sum of second losses associated with the rotor segment ripple currents.

BRIEF DESCRIPTION OF THE DRAWINGS

The foregoing aspects and many of the attendant advantages will become more readily appreciated as the same become better understood by reference to the following detailed description, when taken in conjunction with the accompanying drawings, wherein.

DETAILED DESCRIPTION

Introduction

Figure 1A:
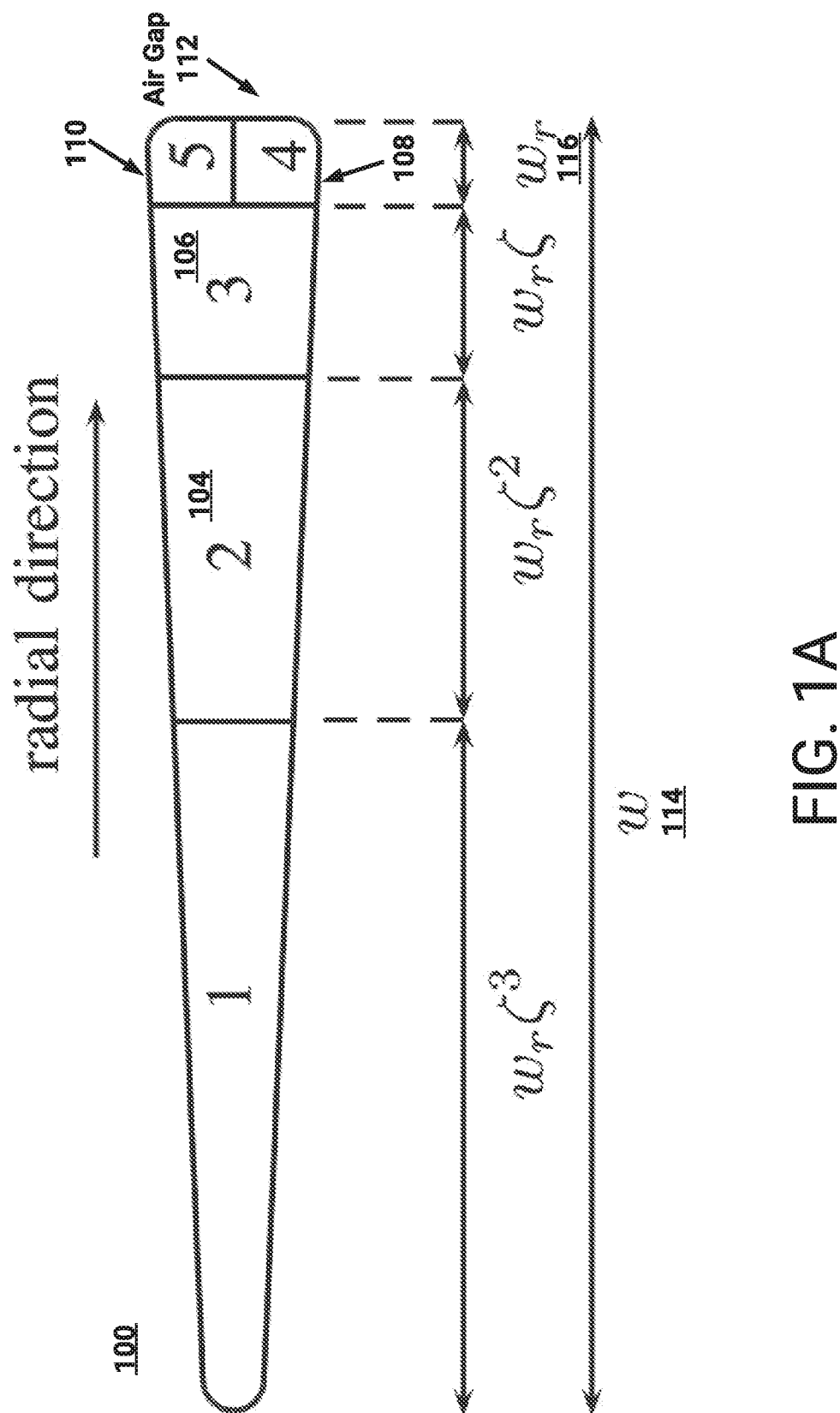
FIG. 1A illustrates an example segmentation of a rotor bar.

This specification describes enhanced techniques for the modeling of induction motor (IMs) designs. By way of illustrative example, one or more aspects of the present application will be described with regard to modeling of squirrel-cage IM designs. As will be described, a system or user device described herein may determine one or more losses (e.g., loss metrics) associated with an IM using a computationally efficient technique. An example loss may include rotor cage loss, such as high frequency rotor cage loss. Another example loss may include core loss, such as core loss associated with the stator or rotor. Advantageously, the effects of saturation, winding, slot harmonics, and non-uniform current density distribution in rotor bars, may be included in these loss metric determinations. Due to the increased computational efficiencies described herein, IM designs may be rapidly analyzed and improved upon. In this way, enhanced IMs may be developed due to an understanding of their efficiency maps over an operating range. For example, an IM may be analyzed in minutes while prior computationally expensive modeling techniques may require days or weeks of processing thus limiting an ability to analyze variations of the IM.

As may be appreciated, an IM may include a rotor and a stator. The rotor, with respect to a squirrel cage IM, may include a multitude of rotor bars. Example rotor bars may include copper rotor bars, aluminum rotor bars, and so on. To provide an understanding of efficiencies and losses associated with an IM, currents associated with these rotor bars may be analyzed. For example, due to winding and slot effects harmonic rotor bar currents may increase at high speeds. Therefore, being able to rapidly model these high-frequency currents may be of paramount importance when developing high-speed, power-dense, motors.

Prior techniques to model these high-frequency currents relied on sophisticated processing techniques, such as time-stepping finite element analysis (TS-FEA). FEA may allow a system to accurately model parameters associated with an IM. However, computing systems implementing FEA-based modeling algorithms typically consume significant computing resources in terms of processors, memory and substantial processing time. For example, to ensure accuracy the use of FEA may require small time-steps (e.g., microsecond steps). These small-steps may increase a number of computations required, such that modeling may take days of processing. This lengthy time makes the use of such techniques impractical.

In an effort to reduce such processing time, prior techniques have attempted to configure processing by implementation of modified FEA-based algorithms. For example, computing devices utilizing a frequency domain FEA-based algorithm can be implemented in which in such algorithms assume all field quantities are sinusoidal at a single frequency. While this allows for an increase in computational efficiency, the results are substantially less accurate and disallow determining slot harmonic effects.

Advantageously, one or more aspects of the present application may include a system configured to utilize model symmetries to limit an extent to which FEA is performed. For example, the system may perform a minimum number (e.g., substantially minimum) of FEA computations to achieve accurate modeling of an IM. FEA computations are also referred to herein as FEA simulations or studies. In this way, the system may substantially reduce an overall computation time. As an example, due to the reduced number of FEA computations the computation time may be reduced by at least two orders of magnitude. In some embodiments, magnetostatic FEA may be coupled with a linearized qd-circuit model (e.g., quadrature direct circuit model) in a synchronous reference frame. This enhanced coupling allows the system to be computationally fast while also allowing accurate modeling by performing FEA. For example, the system may model the effects of saturation, winding and slot harmonics, non-uniform current distribution in rotor bars, and so on.

As will be described, the system obtains information reflecting a design of an IM. In one aspect, the system segments rotor bars of the IM along radial and tangential directions. For example, FIG. 1A illustrates an example segmentation along a rotor bar. This segmentation allows the system to increase an accuracy associated with analyzing the IM. As an example, the segments may be connected between themselves and with end ring segments to form circuit loops. The system may transform physical variables, such as rotor segment variables, into a synchronously rotating reference frame. The system may then linearize the resulting circuit model, with an example circuit model being illustrated in FIG. 1B. As may be appreciated, the reference frame transformation leads to a well-behaved rotor cage self-inductance matrix. For example, it may be substantially constant. Thus, the circuit model may represent a linear-time invariant state-space model which is computationally efficient. Additionally, use of segmentation in the circuit model allows for capturing non-uniform current distribution in the rotor bars due to the skin effect.

Using the above-described circuit model, the system determines ohmic losses which relate to the cage loss and/or core loss described above. To determine the ohmic losses, the system determines induced rotor currents using magnetostatic FEA. Since the circuit model utilizes a synchronously rotating reference frame, the rotor segment currents may be linearly separable into rotor segment nominal currents and rotor segment ripple currents. For example, the rotor segment nominal currents may represent fundamental currents while the rotor segment ripple currents may represent harmonic current components. This separation allows for addressing two simpler sub-problems and thus more efficient computability of the ohmic losses.

Physical variables used to determine the rotor segment currents may then be determined by the system using magnetostatic FEA. In some embodiments, FEA studies may be performed over a grid of magnetomotive force (MMF) and rotor positions which the system selects according to symmetries. As will be described, the physical variables may be periodic. For example, inductances and rotor flux may be periodic. Thus, an extent to which the system performs FEA may be constrained according to this period-icity. Using these physical variables, such as rotor flux, the system determines a time-varying rotor flux ripple signal which drives the rotor segment ripple currents. As an example, the system may use frequency-based transforms (e.g., Fourier transforms). This time-varying rotor flux ripple signal may then be used by the system to efficiently compute the rotor segment ripple currents.

Linearized Circuit Model

Figure 1B:
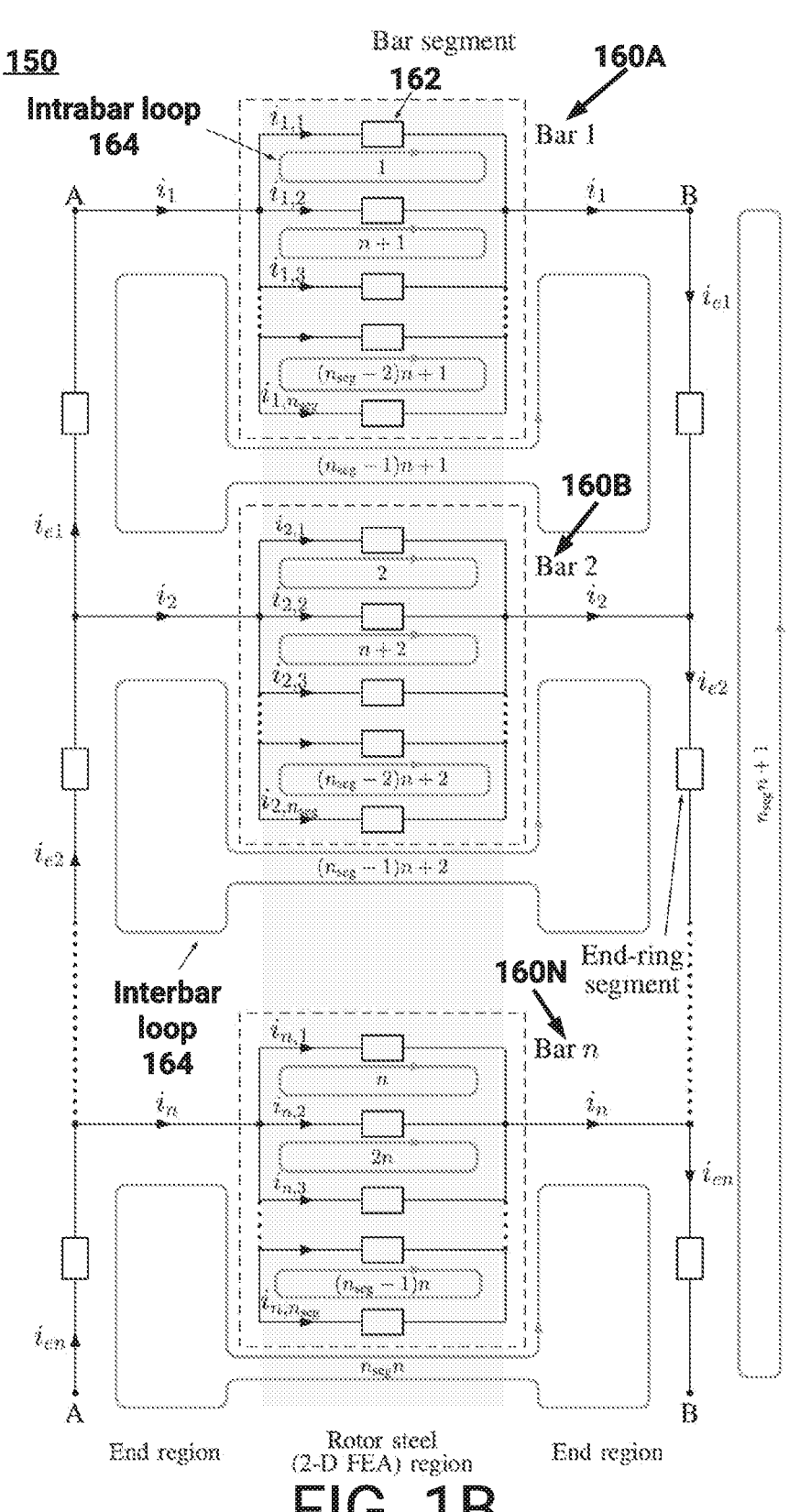
FIG. 1B illustrates an example rotor cage circuit model.

As described above, a design for an induction motor (IM) may be analyzed to determine associated losses. Example losses may include cage loss, core loss, and the like. The design of the IM may include, at least, an arrangement of rotor bars for a rotor. FIGS. 1A-1B illustrate a rotor bar 100 and a circuit model 150 usable by a system to generate a linearized circuit model based on the design of the IM. For example, the rotor bars may be segmented into a multitude of segments. The segmentation increases an accuracy associated with the resulting linearized circuit model. A rotor cage circuit model may be determined based on the segmentation. The rotor cage circuit model may then be transformed to a synchronously rotating frame, with the resulting model being linearized.

The linearized model may be used by the system to determine the rotor segment nominal currents and rotor segment ripple currents described herein. For example, these currents may be used to determine losses associated with the design for the IM. Determining losses is described in more detail below, with respect to FIGS. 2A-2C. At least these features will now be described.

FIG. 1A illustrates an example segmentation of a rotor bar 100. The example segmentation may be performed by the system described herein. The illustrated rotor bar 100 may represent an example of drop shaped rotor bar. It may be appreciated that other rotor bar designs may be used and fall within the scope of the disclosure herein. The rotor bar 100 may be divided into an arbitrary number of segments, with the illustrated example of five segments being one embodiment. These segments may be along radial and/or tangential directions. For example, segments 102, 104, and 106 are segmented along a radial direction. In this example, segment 106 is separated from segments 108 and 110 along the radial direction. As another example, segments 108 and 110 are segmented tangentially such that the segments 108 and 110 are divided using a horizontal line.

In some embodiments, the segmentation along the radial direction may follow a geometric series, with the thinnest element being closest to an air gap 112. Without being constrained by theory, it may be appreciated that current density may exhibit the largest variation closest to the air gap. Thus, the widths 114, may vary according to the geometric series with the width 116 for segments 108 and 110 being the smallest to enhance accuracy.

The segmentation may vary according to desired accuracy and/or user preferences. For example, a user may utilize the system (e.g., a user device or other system) to obtain a design for an IM. In this example, the system may segment the rotor bars as graphically represented in FIG. 1A. The segmentation may optionally conform to a standardized segmentation. Example standardized segmentation may include the geometric series described above, uniform segmentation, and so on. The segmentation may optionally conform to user preferences. For example, a user may use the system to provide information identifying the segmentation to be used. The user may also specify a portion of the rotor bar about which they prefer having more detail. In this way, the segmentation for this portion may be increased such that accuracy is enhanced.

FIG. 1B illustrates an example rotor cage circuit model 150, which includes example rotor bars 160A-N (e.g., rotor bars per pole-pair) with respective segments. The segments may be determined according to the techniques described in FIG. 1A. An example segment 162 is illustrated with respect to rotor bar 160A. As understood by those skilled in the art, example techniques (e.g., Kirchoff's voltage law) may be used to describe the circuit model 150. For example, Kirchoff's voltage law may be used with the intrabar loops (e.g., loop 164) and interbar loops (e.g., loop 162) to determine the following equation:

$$P_1 R_{seg} i_{seg} + R_e P_2 i_e + \frac{d}{dt}(P_1 \lambda_{seg} + P_2 \lambda_e) = 0$$

where $P_1$ and $P_2$ represent loop matrices for bar and end-ring segment branches respectively, where $R_{seg}$ represents a resistance matrix, where $i_e$ is a vector of end-ring segment currents ranging from $i_{e1}$ to $i_{en}$, where $i_{seg}$ represents a vector all of rotor segment currents with the rotor segment currents ranging from $i_{l,1}$ to $i_{n,\,n\_seg}$, where $\lambda_{seg}$ represents a vector of all fluxes (e.g., per pole pair) with the flux (between a segment and the shaft center) ranging from $\lambda_{l,1}$ to $\lambda_{n,\,n\_seg}$, and where $\lambda_e$ is a vector of end-ring segment fluxes.

The rotor cage circuit model 150 may then be transformed into a synchronously rotating reference frame. Physical variables associated with the rotor cage circuit model 150 may be transformed, such as the rotor segment currents and fluxes. While the orientation of the reference frame may be arbitrary, in some embodiments the q-axis may be aligned in the direction of fundamental stator magnetomotive force (MMF).

The above-described equation may thus be transformed into qd variables. As may be appreciated by those skilled in the art, extended-qd variables may be used. The equation may be transformed into the following two formulas:

$$R_{qdr}^- i_{qdseg}^- + \Omega_s^- \lambda_{qdr}^- + \frac{d}{dt}\lambda_{qdr}^- = 0$$

$$\lambda_{qdr}^- = L_{qdr,seg}^-\left(i_{qds}, i_{qdseg}^-, \theta_e, \chi\right)i_{qdseg}^- + L_{qdr,s}^-\left(i_{qds}, i_{qdseg}^-, \theta_e, \chi\right)i_{qds}$$

where $$\Omega_s^-$$

is associated with a slip frequency matrix, $$L_{qdr,seg}^-$$

is associated with inductance (e.g., segment to segment inductances), $i_{qds}$ represents stator currents, $$i_{qdseg}^-$$

represents rotor segment currents, $\theta_e$ is an electrical angle associated with synchronous speed, and $\chi$ represents the electrical slip angle. In some embodiments, the minus superscript may represent reduced matrices and vectors obtained by eliminating dependent circuit equations (e.g., keeping independent equations).

As described above, the system described herein determines ohmic loss (e.g., cage loss, core loss). The ohmic loss may be defined by constant values of rotor speed, slip frequency, and qd stator currents (e.g., in view of a balanced stator excitation). To determine ohmic loss, the system determines rotor segment currents. For example, the system determines rotor segment currents for the stator currents, rotor speed, and slip frequency. As may be appreciated, the above-two formulas could be solved in the time domain with numerical integration. However, this is computationally intractable and thus technically disfavored.

Therefore, a linearized system of formulas may be used instead. The above-described process may thus allow for a dynamic model for rotor cage dynamics with a constant, or substantially constant, system matrix. This yields a linear time-invariant state-space model which is computational efficient. To linearize the formulas, a first order expansion may be used, with the formulas being linearized around a constant vector of qd stator and rotor segment currents. This may result in steady state currents, with the perturbed rotor bar segment currents being:

$$ i_{qdseg}^- = i_{qdseg0}^- + \delta i_{qdseg}^- $$

where $$ i_{qdseg0}^- $$

represents the rotor segment nominal currents described herein and $$ \delta i_{qdseg}^- $$

represents the rotor segment ripple currents described herein. As will be described in more detail below, with respect to FIG. 2A, the system determines rotor segment nominal currents with respect to the following equation:

$$ \left[ R_{qdr}^- + \Omega_s^- \langle L_{qdr,seg}^- \rangle \right] i_{qdseg0}^- + \Omega_s^- \langle L_{qdr,s}^- \rangle i_{qds} = 0 $$

with the above-equation yielding the rotor segment nominal currents which create an air-gap magnetomotive force (MMF) that rotates at synchronous speed.

Additionally, the system determines rotor segment ripple currents with respect to the following equation:

$$ \left[ R_{qdr}^- + \Omega_s^- \langle L_{qdr,seg}^{inc-} \rangle \right] \delta i_{qdseg}^- + \langle L_{qdr,seg}^{inc-} \rangle \frac{d}{dt} \delta i_{qdseg}^- + \Omega_s^- \tilde\lambda_{qdr0}^- + \frac{d}{dt} \tilde\lambda_{qdr0}^- = 0 $$

where $$ < L_{qdr,seg}^{inc-} > $$

represents a time-averaged incremental inductance matrix, where $$ \tilde\lambda_{qdr0}^- $$

represents flux ripple (e.g., time-varying flux ripple), and with the equation being solvable efficiently in the frequency domain.

Example Flowchart—Determining Loss

As described above, a design for an induction motor (IM) may be analyzed to obtain a linearized circuit model. Based on this linearized circuit model, equations to determine rotor segment nominal currents and rotor segment ripple currents may be obtained. Described below are example techniques for a system to determine these currents using, at least in part, finite element analysis (FEA). Advantageously, an extent to which FEA is required may be substantially reduced as compared to prior techniques. In this way, the determined currents may be used to determine loss (e.g., cage loss, core loss) for the design in a computationally efficient manner.

Figure 2A:
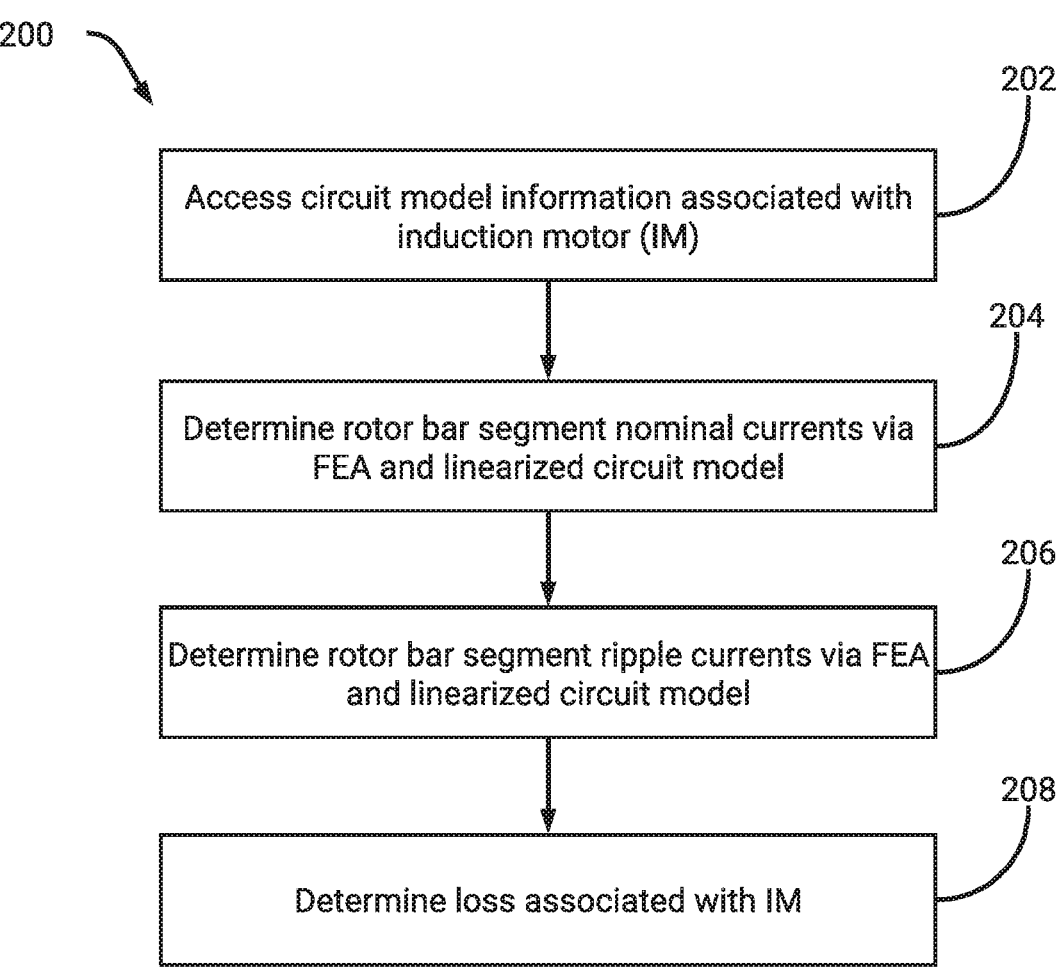
FIG. 2A is a flowchart of an example process for determining loss associated with an induction motor (IM) according to the techniques described herein.

FIG. 2A is a flowchart of an example process 200 for determining loss associated with an induction motor (IM) according to the techniques described herein. For convenience, the process 200 will be described as being performed by a system of one or more computers or processors. For example, the process 200 may performed using a user device (e.g., a tablet, laptop, computer), a computing system, server system, a cluster computing system, and so on.

At block 202, the system accesses circuit model information associated with an IM being designed. For example, the circuit model information may indicate segmentation of rotor bars. The circuit model information may further indicate geometry information (e.g., rotor bar geometry, stator geometry, and so on), a number of rotor bars, a type of rotor bars, materials from which the rotor bars are created, materials from the rotor is created, materials from which the stator is created, physical characteristics, and so on. As will be described, the system uses the linearized circuit model described in FIG. 1B to determine rotor currents associated with the IM, such as rotor segment nominal currents and rotor segment ripple currents.

In some embodiments, the system generates the circuit model information based on input information associated with the IM. For example, a user of the system may provide information reflecting a representation of the IM. Example input information may indicate geometry information, a number of rotor bars, and so on. The system may segment the rotor bars as described in FIG. 1A. Additionally, the user may identify segmentation which is to be performed on the rotor bars (e.g., via a user interface).

At block 204, the system determines rotor bar segment currents using finite element analysis (FEA) and a linearized circuit model. As described above, with respect to FIGS. 1A-1B, the rotor segment nominal currents may be determined using the circuit model information according to the following equation based on use of the linearized circuit model:

$$\left[R_{qdr}^{-} + \Omega_s^{-}\left\langle L_{qdr,seg}^{-}\right\rangle\right]\bar{i}_{qdseg0} + \Omega_s^{-}\left\langle L_{qdr,s}^{-}\right\rangle i_{qds} = 0$$

In some embodiments, the system may use a fixed-point algorithm solve the equation. FEA may be used to determine, at least, the time-averaged segment inductance matrix $$\left\langle L_{qdr,seg}^{-}\right\rangle$$

and time-averaged stator inductance matrix $$\left\langle L_{qdr,s}^{-}\right\rangle,$$

which are included in the equation, over a grid of $\theta_e$ and $\chi$. As described above, $\theta_e$ is an electrical angle associated with synchronous speed $\theta_e$ and $\chi$ represents the electrical slip angle associated with the slip frequency $\omega_s$. The rotor bar segment currents may be then determined by the system using these inductance matrices (e.g., via the fixed-point algorithm). For example, the inductance matrices obtained or extracted using FEA is coupled by the system as input to the linear circuit model. In this example the information is an input to solve the above-identified equation (e.g., via the fixed-point algorithm). Thus, a magnetization profile throughout the IM may be established.

Advantageously, the qd inductances and the flux are periodic according to geometric symmetries based on the geometries of the stator and the rotor and on winding configurations of the stator. For example, the periodicities may be every $$\frac{\pi}{3} \text{ and } \frac{2\pi}{n}$$

radians with respect to $\theta_e$ and $\chi$. In this example, the periodicities may be based on the stator slots per pole per phase being an integer (e.g., for a three phase IM). As understood by those skilled in the art, these electrical angles are associated with magnetomotive force (MMF) and rotor positions. Thus, an extent to which the system is required to perform FEA may be limited. For example, the system performs FEA studies over the grid 210 illustrated in FIG. 2B. In this example, FEA may be performed at positions within respective periods for $\theta_{ex}$ and $\chi_y$.

Figure 2B:
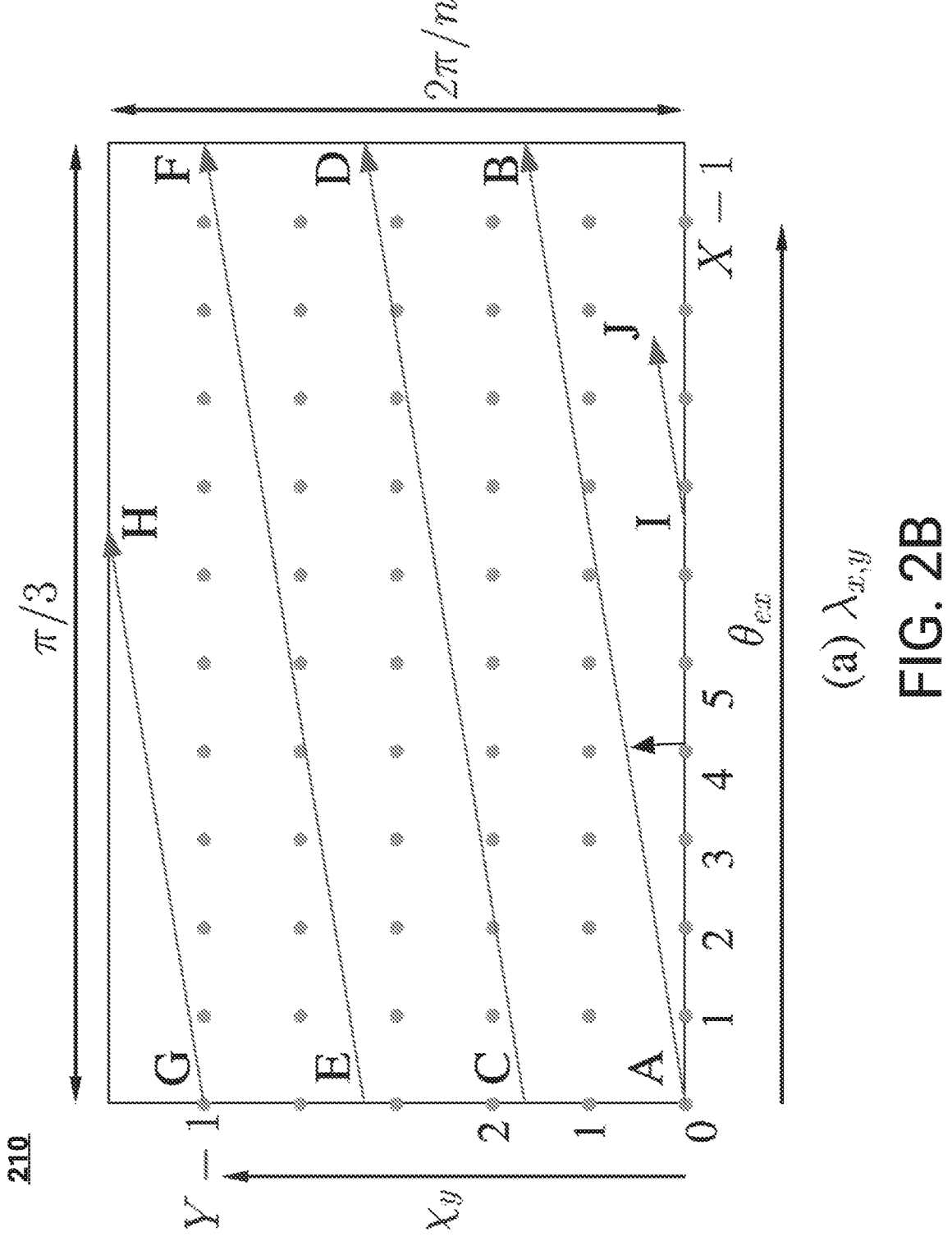
FIG. 2B illustrates an example grid over which finite element analysis (FEA) studies may be performed.

With respect to FIG. 2B, $\theta_{ex}$ and $\chi_y$ for the grid 210 may therefore represent:

$$\theta_{ex} = \frac{x}{X}\frac{\pi}{3}, x = 0, 1, \dots, X-1$$

$$\chi_y = \frac{y}{Y}\frac{2\pi}{n}, y = 0, 1, \dots, Y-1$$

where X and Y may be odd. The line segments AB, CD, EF, GH, and IJ have slope equal to the slip $$\frac{\omega s}{\omega e}$$

and denote the time variation of modulus $$\left(\theta_e, \frac{\pi}{3}\right)$$

and modulus $$\left(\theta_s, \frac{2\pi}{n}\right).$$

At block 206, the system determines rotor bar segment ripple currents using FEA and the linearized circuit model. In some embodiments, the system uses a state-space model to determine the rotor bar segment ripple currents using the circuit model information according to the following equation based on the linearized circuit model:

$$\left[R_{qdr}^{-} + \Omega_s^{-}\left\langle L_{qdr,seg}^{inc-}\right\rangle\right]\delta\bar{i}_{qdseg} + \left\langle L_{qdr,seg}^{inc-}\right\rangle\frac{d}{dt}\delta\bar{i}_{qdseg} + \Omega_s^{-}\tilde{\lambda}_{qdr0}^{-} + \frac{d}{dt}\tilde{\lambda}_{qdr0}^{-} = 0$$

which may also be expressed as:

$$\frac{d}{dt}\delta\bar{i}_{qdseg} = -\left\langle L_{qdr,seg}^{inc-}\right\rangle^{-1}$$

$$\left[R_{qdr}^{-} + \Omega_s^{-}\left\langle L_{qdr,seg}^{inc-}\right\rangle\right]\delta\bar{i}_{qdseg} - \left\langle L_{qdr,seg}^{inc-}\right\rangle^{-1}\left[\Omega_s^{-}\tilde{\lambda}_{qdr0}^{-} + \frac{d}{dt}\tilde{\lambda}_{qdr0}^{-}\right].$$

FEA may be used to determine, at least, the time-averaged incremental inductance matrix $$< L_{qdr,seg}^{inc-} >$$

and flux ripple $$\tilde{\lambda}_{qdr0}^{-}$$

according to the grid 210 described above. For example, the system performs FEA over the grid of fundamental magnetomotive (MMF) positions and rotor positions.

The output of the FEA simulations may include incremental inductance matrices. The system then averages the incremental inductance matrices over the FEA simulations to obtain $$\left\langle L_{qdr,seg}^{inc-}\right\rangle$$

as included in the above equations.

The output of the FEA simulations may also include flux ripple samples. To determine the flux ripple $$\bar{\lambda}_{qdr0}$$

the system generates a time-varying rotor flux ripple signal. As will be described, the system generates the time-varying rotor flux ripple signal via use of frequency-based transforms. For example, the system performs a two-dimensional transform, such as a discrete Fourier transform (DFT) of the flux ripple samples. The DFT may be used to extract the harmonic components of the flux ripple samples. The harmonic components may represent components as a function of fundamental MMF positions and rotor positions. The system then performs an inverse transform, such that the system obtains the time-varying rotor flux ripple signal. This time-varying rotor flux ripple signal may be used by the system to efficiently determine the rotor segment ripple currents.

With respect to the flux ripple, $\lambda_{x,y}$ may represent an element of $$\bar{\lambda}_{qdr0}$$

sampled at $\theta_e$ and $\chi$. A two-dimensional transform, such as a DFT, of $\lambda_{x,y}$ may then represent:

$$\ell_{u,v} = \sum_{x=0}^{X-1}\sum_{y=0}^{Y-1}\lambda_{x,y}\exp\left\{-j2\pi\left(\frac{xu}{X}+\frac{yv}{Y}\right)\right\}$$

for u=0, 1, . . . , X−1 and v=0, 1, . . . , Y−1, and with the complex DFT coefficients satisfying:

$$\ell_{u,v}^{*} = \ell_{X-u,Y-v}, \text{ for } uv > 0,$$

$$\ell_{0,v}^{*} = \ell_{0,Y-v}, \text{ for } v > 0,$$

$$\ell_{u,0}^{*} = \ell_{X-u,0}, \text{ for } u > 0,$$

where $$\ell_{u,v}^{*}$$

is the complex conjugate of $\ell_{u,v}$.

An interpolation function $\lambda(\theta_e, \chi)$ may then be used by the system based on an inverse transform (e.g., inverse DFT) of $\ell_{u,v}$. For example, the inverse transform may correspond to the following equation:

$$\lambda(\theta_e, \chi) = \frac{1}{XY}\sum_{u=0}^{X-1}\sum_{v=0}^{Y-1}\ell(u, v)\exp\{j(6u\theta_e + nv\chi)\}.$$

where $\theta_e$ and $\chi$ may respectively be expressed as functions of time, respectively $\omega_e t$ and $\omega_s t$, such that $\lambda$ may be expressed as a function of time $\lambda(t)$:

$$\lambda(t) = \frac{1}{XY}\ell_{0,0} + \frac{2}{XY}\sum_{u=1}^{(X-1)/2}|\ell_{u,0}|\cos(\omega_{u,0}t + \phi_{u,0}) +$$

-continued $$\frac{2}{XY}\sum_{v=1}^{(Y-1)/2}|\ell_{0,v}|\cos(\omega_{0,v}t + \phi_{0,v}) + \frac{2}{XY}\sum_{u=1}^{(X-1)/2}\sum_{v=1}^{(Y-1)/2}|\ell_{u,v}|\cos(\omega_{u,v}t + \phi_{u,v}) +$$

$$\frac{2}{XY}\sum_{u=1}^{(X-1)/2}\sum_{v=1}^{(Y-1)/2}|\ell_{u,Y-v}|\cos(\omega_{u,-v}t + \phi_{u,Y-v})$$

where $| \ell_{u,v}|$ and $\varnothing_{u,v}$ denote the amplitude and phase of $\ell_{u,v}$ respectively, and the frequencies are:

$$\omega_{u,v} = (6\omega_e)u + (n\omega_s)v, \omega_{u,-v} = (6\omega_e)u - (n\omega_s)v$$

Figure 2C:
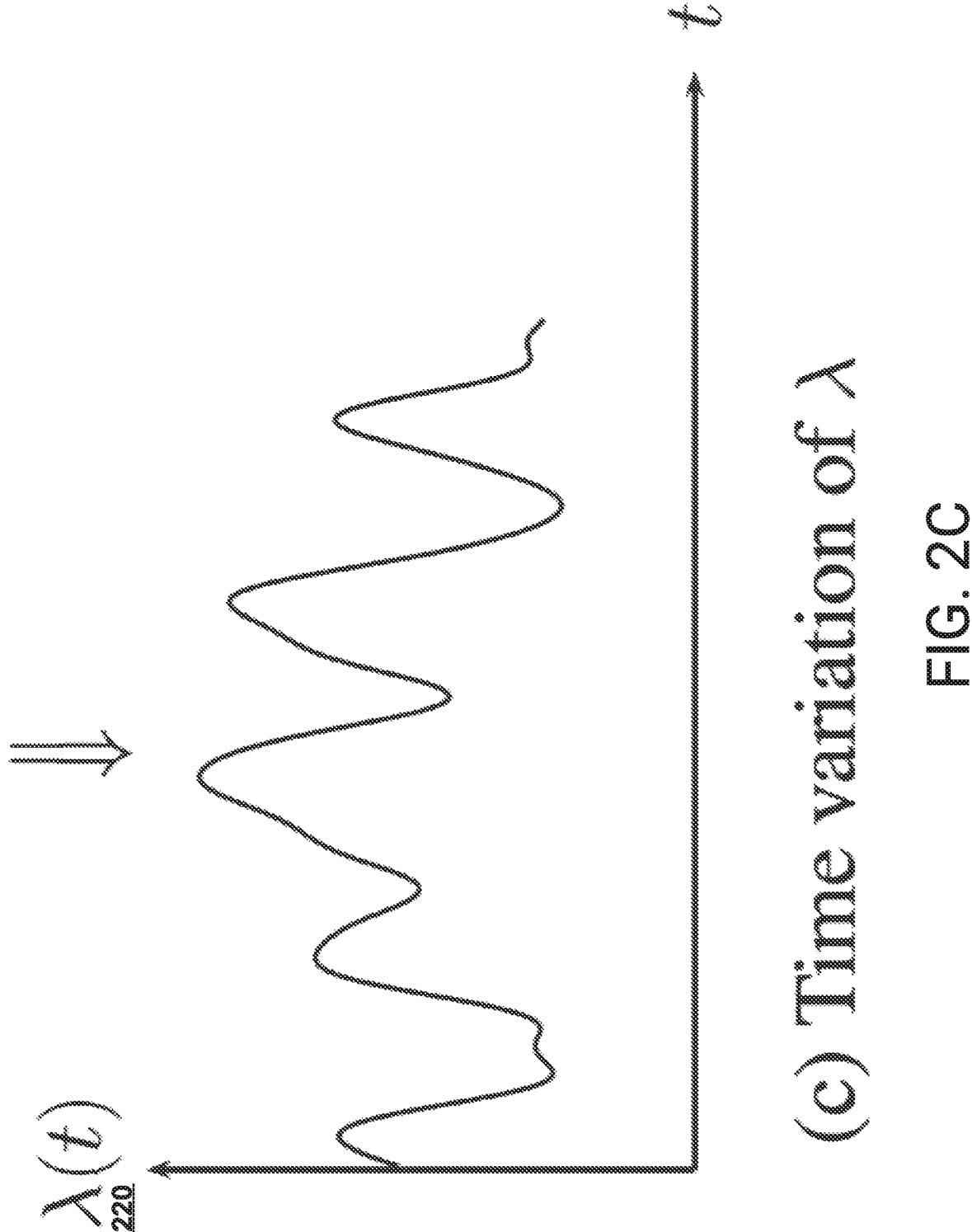
FIG. 2C illustrates an example time-varying rotor flux ripple signal.

For example, FIG. 2C illustrates an example of a reconstructed $\lambda(t)$ 220.

The system determines the flux ripple $$\bar{\lambda}_{qdr0},$$

using the above-identified equation for the time-varying rotor flux ripple signal $\lambda(t)$. For example, the flux ripple may be determined according to a summation of harmonics defined by the amplitudes, phases, and frequencies, identified above.

Using the determined flux ripple $$\bar{\lambda}_{qdr0},$$

and time-averaged incremental inductance matrix $$\langle L_{qdr,seg}^{inc-}\rangle,$$

the system determines the rotor segment ripple currents. For example, the system may use a state-space model as described above to compute the equations for rotor segment ripple current.

At block 208, the system determines loss associated with the IM. With respect to cage loss, the system may use the determined rotor segment nominal currents and rotor segment ripple currents to determine loss. For example, the system may compute cage loss with respect to the rotor segment nominal currents and resistances:

$$P_{cage} = pi_{qdseg}^{T}Ri_{qdseg}$$

As another example, the system may compute the cage loss with respect to the rotor segment ripple currents and resistances:

$$\langle P_k \rangle = \frac{p}{2}|\delta i_k|^T R|\delta i_k|$$

In this way, the total average cage loss may be determined as the sum of individual harmonic losses using the above-identified equations.

While FIG. 2A focused on determining cage loss, in some embodiments core loss for the IM may be determined. To determine core loss, the system may determine flux densities in the stator and rotor using FEA conducted over the grid 210. The FEA may use the rotor segment nominal currents determined at block 204. Time domain harmonics in the flux density waveforms may then be obtained using a transform, such as a two-dimensional DFT, as described in block 206. For example, harmonic components may be extracted and transformed as a function of time. The system may then determine core loss according to the flux densities in the stator and rotor.

Example Block Diagram

Figure 3:
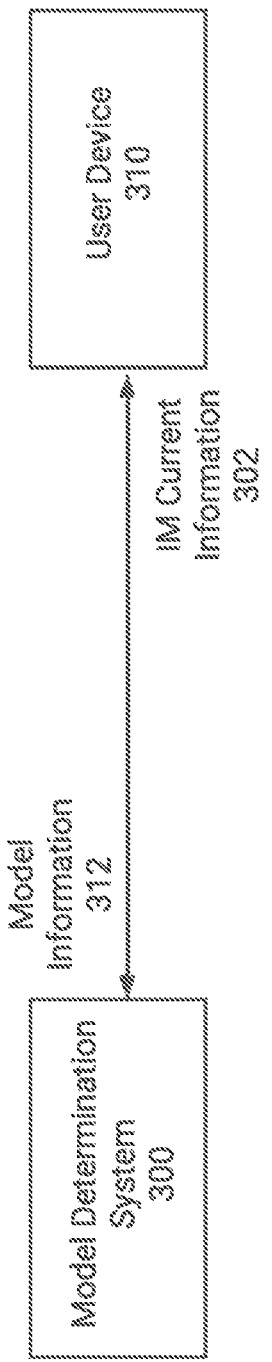
FIG. 3 is a block diagram of a model determination system in communication with a user device.

FIG. 3 is a block diagram of a model determination system 300 in communication with a user device 310. The model determination system 300 may be a system of one or more computers, one or more computers executing on a system of one or more computers, and so on. The user device 310 may be a laptop, tablet, wearable device, computer, and so on. In some embodiments, the system 300 may perform the process 200 described above with respect to FIG. 2A. In some embodiments, the user device 310 may perform the process 200.

As described herein the model determination system 300 may receive model information 312 from the user device 310. For example, the information 312 may be received via a network (e.g., the internet), a local connection, and so on. Example model information 312 may reflect the information accessed in block 202 of FIG. 2A. The model determination system 300 may then determine IM current information 302 as described in FIG. 2A. The IM current information 302 may include the rotor segment nominal currents and rotor segment ripple currents. In some embodiments, the system 300 may provide the cage losses and/or core losses in addition to the IM current information 302 or instead of the IM current information 302.

The system 300 may then output the IM current information 302 to the user device 310. In some embodiments, this information 302 may be provided according to a particular format or schema. The format or schema may be based on modeling software executed by the user device 310. Additionally, or alternatively, the system 300 may output the cage losses and/or core losses to the user device 310. The user device 310 may present the IM current information 302 and/or losses. For example a graphical depiction of the information 302 or loses may be presented in a user interface (e.g., an interactive user interface).

Other Embodiments

All of the processes described herein may be embodied in, and fully automated, via software code modules executed by a computing system that includes one or more computers or processors. The code modules may be stored in any type of non-transitory computer-readable medium or other computer storage device. Some or all the methods may be embodied in specialized computer hardware.

Many other variations than those described herein will be apparent from this disclosure. For example, depending on the embodiment, certain acts, events, or functions of any of the algorithms described herein can be performed in a different sequence or can be added, merged, or left out altogether (for example, not all described acts or events are necessary for the practice of the algorithms). Moreover, in certain embodiments, acts or events can be performed concurrently, for example, through multi-threaded processing, interrupt processing, or multiple processors or processor cores or on other parallel architectures, rather than sequentially. In addition, different tasks or processes can be performed by different machines and/or computing systems that can function together.

The various illustrative logical blocks and modules described in connection with the embodiments disclosed herein can be implemented or performed by a machine, such as a processing unit or processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A processor can be a microprocessor, but in the alternative, the processor can be a controller, microcontroller, or state machine, combinations of the same, or the like. A processor can include electrical circuitry configured to process computer-executable instructions. In another embodiment, a processor includes an FPGA or other programmable device that performs logic operations without processing computer-executable instructions. A processor can also be implemented as a combination of computing devices, for example, a combination of a DSP and a microprocessor, a plurality of microprocessors, one or more microprocessors in conjunction with a DSP core, or any other such configuration. Although described herein primarily with respect to digital technology, a processor may also include primarily analog components. For example, some or all of the signal processing algorithms described herein may be implemented in analog circuitry or mixed analog and digital circuitry. A computing environment can include any type of computer system, including, but not limited to, a computer system based on a microprocessor, a mainframe computer, a digital signal processor, a portable computing device, a device controller, or a computational engine within an appliance, to name a few.

Conditional language such as, among others, "can," "could," "might" or "may," unless specifically stated otherwise, are understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Disjunctive language such as the phrase "at least one of X, Y, or Z," unless specifically stated otherwise, is understood with the context as used in general to present that an item, term, etc., may be either X, Y, or Z, or any combination thereof (for example, X, Y, and/or Z). Thus, such disjunctive language is not generally intended to, and should not, imply that certain embodiments require at least one of X, at least one of Y, or at least one of Z to each be present.

Any process descriptions, elements or blocks in the flow diagrams described herein and/or depicted in the attached figures should be understood as potentially representing modules, segments, or portions of code which include one or more executable instructions for implementing specific logical functions or elements in the process. Alternate implementations are included within the scope of the embodiments described herein in which elements or functions may be deleted, executed out of order from that shown, or discussed, including substantially concurrently or in reverse order, depending on the functionality involved as would be understood by those skilled in the art.

Unless otherwise explicitly stated, articles such as "a" or "an" should generally be interpreted to include one or more described items. Accordingly, phrases such as "a device configured to" are intended to include one or more recited devices. Such one or more recited devices can also be collectively configured to carry out the stated recitations. For example, "a processor configured to carry out recitations A, B and C" can include a first processor configured to carry out recitation A working in conjunction with a second processor configured to carry out recitations B and C.

It should be emphasized that many variations and modifications may be made to the above-described embodiments, the elements of which are to be understood as being among other acceptable examples. All such modifications and variations are intended to be included herein within the scope of this disclosure.

What is claimed is:

1. A method implemented by a system of one or more processors, the method comprising:
   accessing circuit model information associated with an induction motor (IM), the circuit model information reflecting a plurality of rotor bars of the IM as being segmented into a respective plurality of rotor segments;
   determining rotor segment nominal currents associated with the rotor segments, wherein the determination is based on performing finite element analysis (FEA) over a grid and use of a linearized circuit model, wherein the grid is periodic with respect to a first electrical angle associated with synchronous speed and a second electrical angle associated with slip frequency, and wherein performance of FEA is limited to positions within respective periods of the first electrical angle and second electrical angle, such that performance of FEA is constrained;
   determining rotor segment ripple currents associated with the rotor segments, wherein the determination is based on performance of FEA to extract flux ripple samples over the grid, wherein the flux ripple samples are transformed into a time-varying rotor flux ripple signal, and wherein the rotor segment ripple currents are determined based on the time-varying rotor flux ripple signal;
   determining one or more losses associated with the IM; and
   presenting the losses on a user interface.

2. The method of claim 1, wherein determining rotor segment nominal currents comprises:
   extracting time-averaged inductance matrices via performance of FEA; and
   determining the rotor segment nominal currents using the time-averaged inductance matrices as an input to the linearized circuit model.

3. The method of claim 1, wherein each rotor bar is segmented using a geometric series, and wherein the rotor segments narrow along a radial direction of the rotor bar.

4. The method of claim 1, wherein the linearized circuit model represents a circuit model of the IM transformed into a synchronously rotating frame.

5. The method of claim 1, wherein transforming the flux ripple samples comprises:
   performing a two-dimensional transform of the flux ripple samples, wherein transform coefficients are obtained;
   performing an inverse two-dimensional transform based on the transform coefficients; and obtaining, based on the inverse two-dimensional transform, the time-varying rotor flux ripple signal.

6. The method of claim 5, wherein the inverse two-dimensional transform is performed using an interpolation function which comprises the transform coefficients.

7. The method of claim 1, wherein the losses comprise one or more of cage loss or core loss.

8. The method of claim 7, wherein cage loss is determined based on a first loss associated with the rotor segment nominal currents and a sum of second losses associated with the rotor segment ripple currents.

9. A system comprising one or more processors and non-transitory computer storage media storing instructions that when executed by the one or more processors, cause the processors to perform operations comprising:
   determining rotor segment nominal currents associated with an induction motor (IM), the IM being reflected in circuit model information representing a plurality of rotor bars each comprising a respective plurality of rotor segments, wherein the rotor segment nominal currents are associated with the rotor segments, and wherein the determination is based on performing finite element analysis (FEA) over a grid, wherein the grid is periodic with respect to a first electrical angle associated with synchronous speed and a second electrical angle associated with slip frequency, and wherein performance of FEA is limited to positions within respective periods of the first electrical angle and second electrical angle, such that performance of FEA is constrained;
   determining rotor segment ripple currents associated with the rotor segments, wherein the determination is based on performance of FEA to extract flux ripple samples over the grid, wherein the flux ripple samples are transformed into a time-varying rotor flux ripple signal, and wherein the rotor segment ripple currents are determined based on the time-varying rotor flux ripple signal;
   determining one or more losses associated with the IM; and
   presenting the one or more losses on a user interface.

10. The system of claim 9, wherein each rotor bar is segmented using uniform segmentation, or wherein each rotor bar is segmented using a geometric series, and wherein the rotor segments narrow along a radial direction of the rotor bar.

11. The system of claim 9, wherein determining the rotor segment nominal currents comprises:
   extracting time-averaged inductance matrices via performance of FEA; and
   determining the rotor segment nominal currents using the time-averaged inductance matrices as an input to a linearized circuit model.

12. The system of claim 10, wherein transforming the flux ripple samples comprises:
   performing a two-dimensional transform of the flux ripple samples, wherein transform coefficients are obtained;
   performing an inverse two-dimensional transform based on an interpolation function which comprises the transform coefficients; and
   obtaining, based on the inverse two-dimensional transform, the time-varying rotor flux ripple signal.

13. The system of claim 9, wherein the losses comprise one or more of cage loss or core loss, and wherein cage loss is determined based on a first loss associated with the rotor segment nominal currents and a sum of second losses associated with the rotor segment ripple currents.

* * * * *